United States Patent
Koo et al.

(10) Patent No.: US 9,018,829 B2
(45) Date of Patent: Apr. 28, 2015

(54) EXCITED GAS INJECTION FOR ION IMPLANT CONTROL

(71) Applicant: Varian Semiconductor Equipment Associates, Inc., Gloucester, MA (US)

(72) Inventors: Bon-Woong Koo, Andover, MA (US); Victor Benveniste, Lyle, WA (US); Christopher A. Rowland, Rockport, MA (US); Craig R. Chaney, Lanesville, MA (US); Frank Sinclair, Boston, MA (US); Neil J. Bassom, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/955,009

(22) Filed: Jul. 31, 2013

(65) Prior Publication Data

US 2013/0313443 A1    Nov. 28, 2013

Related U.S. Application Data

(63) Continuation of application No. 12/328,096, filed on Dec. 4, 2008, now Pat. No. 8,501,624.

(51) Int. Cl.
| | |
|---|---|
| *H01J 27/02* | (2006.01) |
| *H01J 27/08* | (2006.01) |
| *H01J 37/08* | (2006.01) |
| *H01J 37/317* | (2006.01) |
| *H01J 37/32* | (2006.01) |

(52) U.S. Cl.
CPC ............. *H01J 27/022* (2013.01); *H01J 37/08* (2013.01); *H01J 37/3171* (2013.01); *H01J 37/32357* (2013.01); *H01J 37/32412* (2013.01); *H01J 37/32422* (2013.01); *H01J 2237/006* (2013.01); *H01J 2237/061* (2013.01); *H01J 2237/0815* (2013.01); *H01J 2237/24514* (2013.01)

(58) Field of Classification Search
CPC ................. H01J 27/02–27/26; H01J 2237/08–2237/0827; H01J 49/00–49/18; H01J 37/08
USPC ............. 313/231.01–231.71, 356.1–363.1; 118/723 R–723 IR; 315/111.01–111.91
See application file for complete search history.

(56) References Cited

U.S. PATENT DOCUMENTS

| | | | |
|---|---|---|---|
| 2,017,070 A | 10/1935 | Lazier | |
| 5,318,654 A * | 6/1994 | Maruyama et al. | 118/723 MR |
| 6,095,085 A * | 8/2000 | Agarwal | 118/723 MP |
| 6,124,675 A * | 9/2000 | Bertrand et al. | 313/359.1 |
| 6,656,282 B2 | 12/2003 | Kim et al. | |
| 6,805,779 B2 * | 10/2004 | Chistyakov | 118/723 R |
| 7,629,590 B2 | 12/2009 | Horsky et al. | |
| 7,750,575 B2 * | 7/2010 | Chistyakov | 118/723 DC |
| 2005/0082001 A1 | 4/2005 | Sugiura | |

FOREIGN PATENT DOCUMENTS

| | | |
|---|---|---|
| CN | 1894763 A | 1/2007 |
| CN | 101313085 A | 11/2008 |

(Continued)

*Primary Examiner* — Mariceli Santiago

(57) ABSTRACT

An ion source includes an ion chamber housing defining an ion source chamber, the ion chamber housing having a side with a plurality of apertures. The ion source also includes an antechamber housing defining an antechamber. The antechamber housing shares the side with the plurality of apertures with the ion chamber housing. The antechamber housing has an opening to receive a gas from a gas source. The antechamber is configured to transform the gas into an altered state having excited neutrals that is provided through the plurality of apertures into the ion source chamber.

12 Claims, 10 Drawing Sheets

(56) References Cited

FOREIGN PATENT DOCUMENTS

| | | | |
|---|---|---|---|
| EP | 1593755 A1 | 9/2005 |
| JP | 5314940 A | 11/1993 |
| JP | 06-187936 | 7/1994 |
| JP | 09326383 A * | 12/1997 |
| JP | 10-241591 A | 9/1998 |
| WO | 9940609 A1 | 8/1999 |

* cited by examiner

EXCITED GAS INJECTION FOR ION IMPLANT CONTROL

CROSS REFERENCE TO RELATED APPLICATIONS

This application is a continuation of prior U.S. application Ser. No. 12/328,096 filed Dec. 4, 2008.

BACKGROUND OF THE INVENTION

Ion implanters are commonly used in the production of semiconductor wafers. An ion source is used to create a beam of charged ions, which is then directed toward the wafer. As the ions strike the wafer, they impart a charge in the area of impact. This charge allows that particular region of the wafer to be properly "doped". The configuration of doped regions defines their functionality, and through the use of conductive interconnects, these wafers can be transformed into complex circuits.

A block diagram of a representative ion implanter 1 is shown in FIG. 1. Power supply 2 supplies the required energy to the ion source 3 to enable the generation of ions. An ion source 3 generates ions of a desired species. In some embodiments, these species are mono-atoms, which are best suited for high-energy implant applications. In other embodiments, these species are molecules, which are better suited for low-energy implant applications. The ion source 3 has an aperture through which ions can pass. These ions are attracted to and through the aperture by electrodes 4. These ions are formed into a beam 95, which then passes through a mass analyzer 6. The mass analyzer 6, having a resolving aperture, is used to remove unwanted components from the ion beam, resulting in an ion beam having the desired energy and mass characteristics passing through resolving aperture. Ions of the desired species then pass through a deceleration stage 8, which may include one or more electrodes. The output of the deceleration stage is a diverging ion beam.

A corrector magnet 13 is adapted to deflect the divergent ion beam into a set of beamlets having substantially parallel trajectories. Preferably, the corrector magnet 13 comprises a magnet coil and magnetic pole pieces that are spaced apart to form a gap, through which the ion beamlets pass. The coil is energized so as to create a magnetic field within the gap, which deflects the ion beamlets in accordance with the strength and direction of the applied magnetic field. The magnetic field is adjusted by varying the current through the magnet coil. Alternatively, other structures, such as parallelizing lenses, can also be utilized to perform this function.

Following the angle corrector 13, the ribbon beam is targeted toward the workpiece. In some embodiments, a second deceleration stage 11 may be added. The workpiece is attached to a workpiece support 15. The workpiece support 15 provides a variety of degrees of movement for various implant applications.

Referring to FIG. 2, a traditional ion source that may be incorporated into the ion implanter 1 is shown. The ion source shown in FIG. 2 may include a chamber housing 10 that defines an ion source chamber 14. One side of the chamber housing 10 has an extraction aperture 12 through which the ions pass. In some embodiments, this aperture is a hole, while in other applications, such as high current implantation, this aperture is a slot or a set of holes.

A cathode 20 is located on one end of the ion source chamber 14. A filament 30 is positioned in close proximity to the cathode 20, outside of the ion chamber. A repeller 60 is located on the opposite end of the ion source chamber 14.

The filament 30 is energized by filament supply voltage 54. The current passing through the filament 30 heats it sufficiently (i.e. above 2000° C.) so as to produce thermo-electrons. A bias supply voltage 52 is used to bias the cathode 20 at a substantially more positive voltage than the filament 30. The effect of this large difference in voltage is to cause the thermo-electrons emitted from the filament to be accelerated toward the cathode. As these electrons bombard the cathode, the cathode heats significantly, often to temperatures over 2000° C. The cathode, which is referred to as an indirectly heated cathode (IHC), then emits thermo-electrons into the ion source chamber 14.

The arc supply 50 is used to bias the ion chamber housing 10 positively as compared to the cathode. The arc supply typically biases the housing 10 to a voltage about 50-100 Volts more positive than the cathode 20. This difference in voltage causes the electrons emitted from the cathode 20 to be accelerated toward the housing 10.

A magnetic field is preferably created in the direction 62, typically by using magnetic poles 86 located outside the chamber. The effect of the magnetic field is to confine the emitted electrons within magnetic field lines. The emitted electrons, electro-statically confined between cathode and repeller, take the spiral motions along the source magnetic field lines, thus effectively ionize background gases, forming ions (as shown in FIG. 3).

Vapor or gas source 40 is used to provide atoms or molecules into the ion source chamber 14. The molecules can be of a variety of species, including but not limited to inert gases (such as argon or hydrogen), oxygen-containing gases (such as oxygen and carbon dioxide), nitrogen containing gases (such as nitrogen or nitrogen triflouride), and other dopant-containing gases (such as diborane, boron tri-fluoride, or arsenic penta-fluoride). These background gasses are ionized by electron impact, thus forming plasma 80.

At the far end of the chamber 14, opposite the cathode 20, a repeller 60 is preferably biased to the same voltage as the cathode 20. This causes the emitted electrons to be electrostatically confined between cathode 20 and repeller 60. The use of these structures at each end of the ion source chamber 14 maximizes the interaction of the emitted electrons with the background gas, thus generating high-density plasmas.

FIG. 3 shows a different view of the ion source of FIG. 2. The source magnet 86 creates a magnetic field 62 across the ion chamber. The cathode 20 and repeller 60 are maintained at the same potential, so as to effectively confine the electrons, which collide with the background gas thus generate the plasma 80. The electrode set 90 is biased so as to attract the ions to and through the extraction aperture 12. These extracted ions are then formed into an ion beam 95 and are used as described above.

An alternative embodiment of an ion implantation system, plasma immersion, is shown in FIG. 4. The plasma doping system 100 includes a process chamber 102 defining an enclosed volume 103. A platen 134 is positioned in the process chamber 102 to support a workpiece 138. In one instance, the workpiece 138 comprises a semiconductor wafer having a disk shape, such as, in one embodiment, a 300 millimeter (mm) diameter silicon wafer. The workpiece 138 may be clamped to a flat surface of the platen 134 by electrostatic or mechanical forces. In one embodiment, the platen 134 may include conductive pins (not shown) for making connection to the workpiece 138.

A gas source 104 provides a dopant gas to the interior volume 103 of the process chamber 102 through the mass flow controller 106. A gas baffle 170 is positioned in the process chamber 102 to uniformly distribute the gas from the gas source 104. A pressure gauge 108 measures the pressure inside the process chamber 102. A vacuum pump 112 evacuates exhausts from the process chamber 102 through an exhaust port 110 in the process chamber 102. An exhaust valve 114 controls the exhaust conductance through the exhaust port 110.

The plasma doping system 100 may further include a gas pressure controller 116 that is electrically connected to the mass flow controller 106, the pressure gauge 108, and the exhaust valve 114. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108.

The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction.

The plasma doping system may further include a source 101 configured to generate a plasma 140 within the process chamber 102. The source 101 may include a RF source 150, such as a power supply, to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

The plasma doping system 100 also may include a bias power supply 148 electrically coupled to the platen 134. The bias power supply 148 is configured to provide a pulsed platen signal having pulse ON and OFF time periods to bias the platen 134, and, hence, the workpiece 138, and to accelerate ions from the plasma 140 toward the workpiece 138 during the pulse ON time periods and not during the pulse OFF periods. The bias power supply 148 may be a DC or an RF power supply.

The plasma doping system 100 may further include a shield ring 194 disposed around the platen 134. As is known in the art, the shield ring 194 may be biased to improve the uniformity of implanted ion distribution near the edge of the workpiece 138. One or more Faraday sensors such as an annular Faraday sensor 199 may be positioned in the shield ring 194 to sense ion beam current.

The plasma doping system 100 may further include a controller 156 and a user interface system 158. The controller 156 can be or include a general-purpose computer or network of general-purpose computers that may be programmed to perform desired input/output functions. The controller 156 also can include other electronic circuitry or components, such as application-specific integrated circuits, other hardwired or programmable electronic devices, discrete element circuits, etc. The controller 156 also may include communication devices, data storage devices, and software. For clarity of illustration, the controller 156 is illustrated as providing only an output signal to the power supplies 148, 150, and receiving input signals from the Faraday sensor 199. Those skilled in the art will recognize that the controller 156 may provide output signals to other components of the plasma doping system 100 and receive input signals from the same. The user interface system 158 may include devices such as touch screens, keyboards, user pointing devices, displays, printers, etc. to allow a user to input commands and/or data and/or to monitor the plasma doping system via the controller 156.

In operation, the gas source 104 supplies a primary dopant gas containing a desired dopant for implantation into the workpiece 138. The gas pressure controller 116 regulates the rate at which the primary dopant gas is supplied to the process chamber 102. The source 101 is configured to generate the plasma 140 within the process chamber 102. The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 148 provides a pulsed platen signal to bias the platen 134 and, hence, the workpiece 138 to accelerate ions from the plasma 140 toward the workpiece 138 during the pulse ON periods of the pulsed platen signal. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth.

Note that in both systems, gas is supplied to the chamber, which is used to create the ions that are then implanted in the wafer. Traditionally, these gasses include either elemental gasses, such as hydrogen, argon, oxygen, nitrogen, or other molecules, including but not limited to carbon dioxide, nitrogen tri-fluoride, diborane, phosphorus tri-fluoride, boron tri-fluoride, or arsenic penta-fluoride.

As described above, these gasses are ionized to produce the desired ions for implantation. For ion source applications, in order to maximize the generation of a specific ion species, several variables must be controlled, including source gas flow, arc current, ion source materials, wall temperature, and others. Similarly, for plasma implantation applications, factors are used to generate a uniform charged species over the wafer region. Factors, such as source antenna design, pressure, power, target bias voltage, wall/target temperature, and others, are modified to produce the desired ion distribution.

One factor that has not been fully exploited is controlling the characteristics of the incoming source gas. As stated above, different types of gasses are used, depending on the application. However, once a gas is selected, no other modifications are made to that source gas. It would be beneficial to control the composition of the ion species and their spatial distribution by varying the characteristics of the source gas.

SUMMARY

An ion source includes an ion chamber housing defining an ion source chamber, the ion chamber housing having a side with a plurality of apertures. The ion source also includes an antechamber housing defining an antechamber. The antechamber housing shares the side with the plurality of apertures with the ion chamber housing. The antechamber housing has an opening to receive a gas from a gas source. The antechamber is configured to transform the gas into an altered state having excited neutrals that is provided through the plurality of apertures into the ion source chamber.

DETAILED DESCRIPTION

Figure 5:
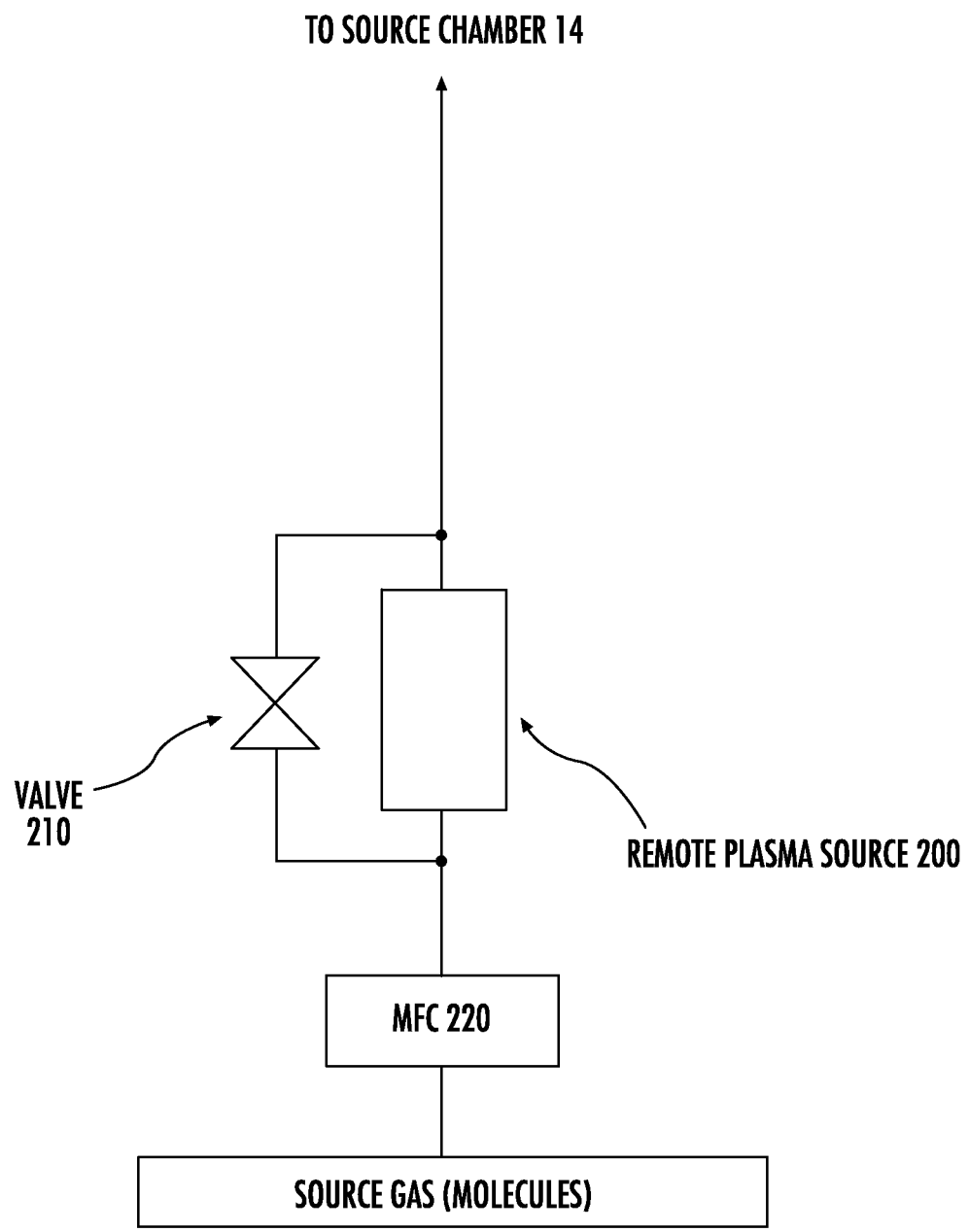
FIG. 5 shows a first embodiment of a gas injection system used in an ion beam application.

FIG. 5 illustrates a first embodiment of a gas injection system used in an ion beam application. Traditionally, gas source 40 is in direct fluid communication with source chamber 14. However, FIG. 5 illustrates the components of the gas injection system according to a first embodiment. In this embodiment, gas source 40 may be in communication with a mass flow controller (MFC) 220. The MFC is responsible for regulating the flow of gas from gas source 40 to a desired flow rate. The output of the MFC is in fluid communication with adjustable bypass valve 210 and remote plasma source 200. The outputs from the adjustable bypass valve 210 and the remote plasma source 200 then join together and are in fluid communication with the source chamber 14.

The remote plasma source 200 can be of any suitable type. However, those sources having a wide operating range with high-density plasma and/or excited neutral species generation capability are preferred. In one embodiment, a microwave plasma source (Electron cyclotron resonance-type) is used, which can operate at pressures between $10^{-6}$ and $10^{-1}$ torr, generating high-density, highly-charged ionized species and/or highly-excited neutral species. In a second embodiment, a microwave plasma source, such as ASTRON® manufactured by MKS Instruments, is used, which can operate at pressures between $10^{-1}$ torr and atmospheric pressure, while generating defragmented or excited neutrals. In other embodiments, a second indirectly heated cathode (IHC) ion source is used to create the heavy neutrals and ionized species, which are then supplied to the ion source 14. In other embodiments, a helicon source, an inductively-coupled plasma (ICP) source, a capacitively-coupled plasma source, a hollow-cathode (HC) source, or a filament-based plasma source can be used. The term "remote plasma source" is intended to encompass any device capable of transforming molecules to an altered state. Altered states include not only plasma, but also ions, excited neutrals, and metastable molecules. As is well known, ions are simply atoms or molecules with an electrical charge associated with them, such as $BF_2^+$. Excited neutrals refer to atoms or molecules, which are still neutral in charge. However, these atoms or molecules have one or more electrons in an excited energy state. Finally, metastable molecules refer to molecule configurations which can be created, such as $B_2F_4$ or $B_4F_5$. However, these molecules may not remain in those configurations for long periods of time, as they are likely to recombine or breakdown into more common molecular configurations. Each of these altered states; plasma, ions, excited neutrals and metastable molecules are of interest. Therefore, it is not a requirement that the remote plasma generator actually create a plasma as its output.

When the remote plasma source 200 is enabled, the molecules from the source gas 40 pass through the MFC 220 and enter the plasma source. Based on the type of remote plasma source and its operating parameters, the source gas can be altered. In certain cases, source gas is acted upon to produce excited neutrals, metastable molecules or ionic molecules. In other cases, the source gas is defragmented into atomic and/or smaller molecular species. In yet other embodiments, the source gas combines to generate heavier or metastable molecules.

If maximum extraction current of a specific ion species is required, the source gas injection can be tuned accordingly in order to optimize (or maximize) the concentration of that specific ion in the source chamber 14. As an example, by operating the remote plasma source at low-pressure and high-power, the production of excited neutrals is promoted. As these excited neutrals are introduced into the source chamber 14, the production of mono-atomic ions and/or multiply-charged ions will be enhanced and, as a result, the extraction of mono-atomic and/or multiply-charged ion current is increased.

For example, currently, source gasses, such as boron trifluoride, are supplied to an ion source chamber. This gas is ionized by the indirectly heated cathode, thereby producing various ion species, such as $BF_2^+$, $BF^+$, $F^+$, $B_xF_y^+$ and $B^+$. In the current disclosure, the source gas is supplied to a remote plasma source, preferably operating at high power and low pressure. This remote plasma source then produces either excited fragmented neutrals, or various fragmented ionized species. These various species are then supplied to the ion source chamber 14. Since the composition and energy levels of the supplied gas have been modified, the output of the ion source is similarly affected, thereby creating more ions of a particular species. In this example, more small ionic species, such as $B^+$ and $BF^+$ are created.

In other embodiments, the production of heavier ions, such as dimmers, trimers or tetramers is desired. The remote plasma source may be operated at much higher pressure, thereby causing molecules to combine into heavier neutral species or metastable molecules. These excited heavy molecules and metastable molecules are then supplied to the ion source chamber 14.

For example, currently, source gasses, such as arsenic and phosphorus, are supplied to a ion source chamber 14. To create heavier species, the chamber must be operated at low power, and typically the output current is quite low. According to one embodiment, these source gasses can be supplied to the remote plasma source 200, operating at a much higher pressure than used to create monoatomic species, to create these heavier neutral species, such as $As_2$, $As_3$, $P_2$, $P_3$ and $P_4$. These heavier species are then supplied to the ion course chamber 14, where they are ionized and extracted into an ion beam. Since the concentration of heavier species is increased through the use of a remote plasma source, the resulting ion beam possesses a greater current.

While the above description highlights the use of the remote plasma source 200 exclusively, the disclosure is not limited to this embodiment. The use of an adjustable bypass valve 210 allows the mixing of molecular source gas and the output from the remote plasma source 200. The resultant mixture can be adjusted such that the ratio of the molecular source gas and the output of the remote plasma source can be finely controlled to achieve the desired effect.

Figure 1:
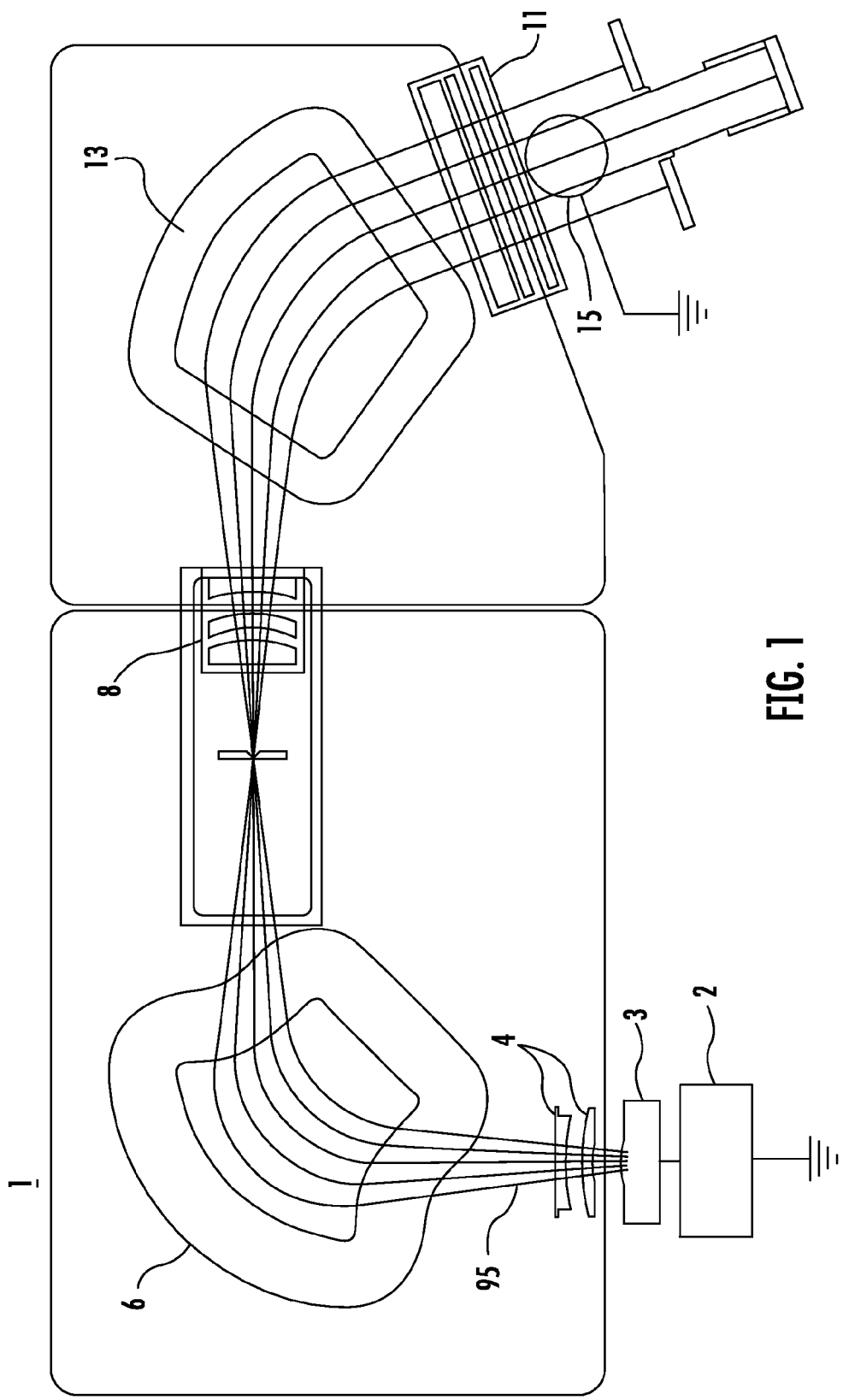
FIG. 1 illustrates a block diagram of a representative high-current ion implanter tool.
Figure 2:
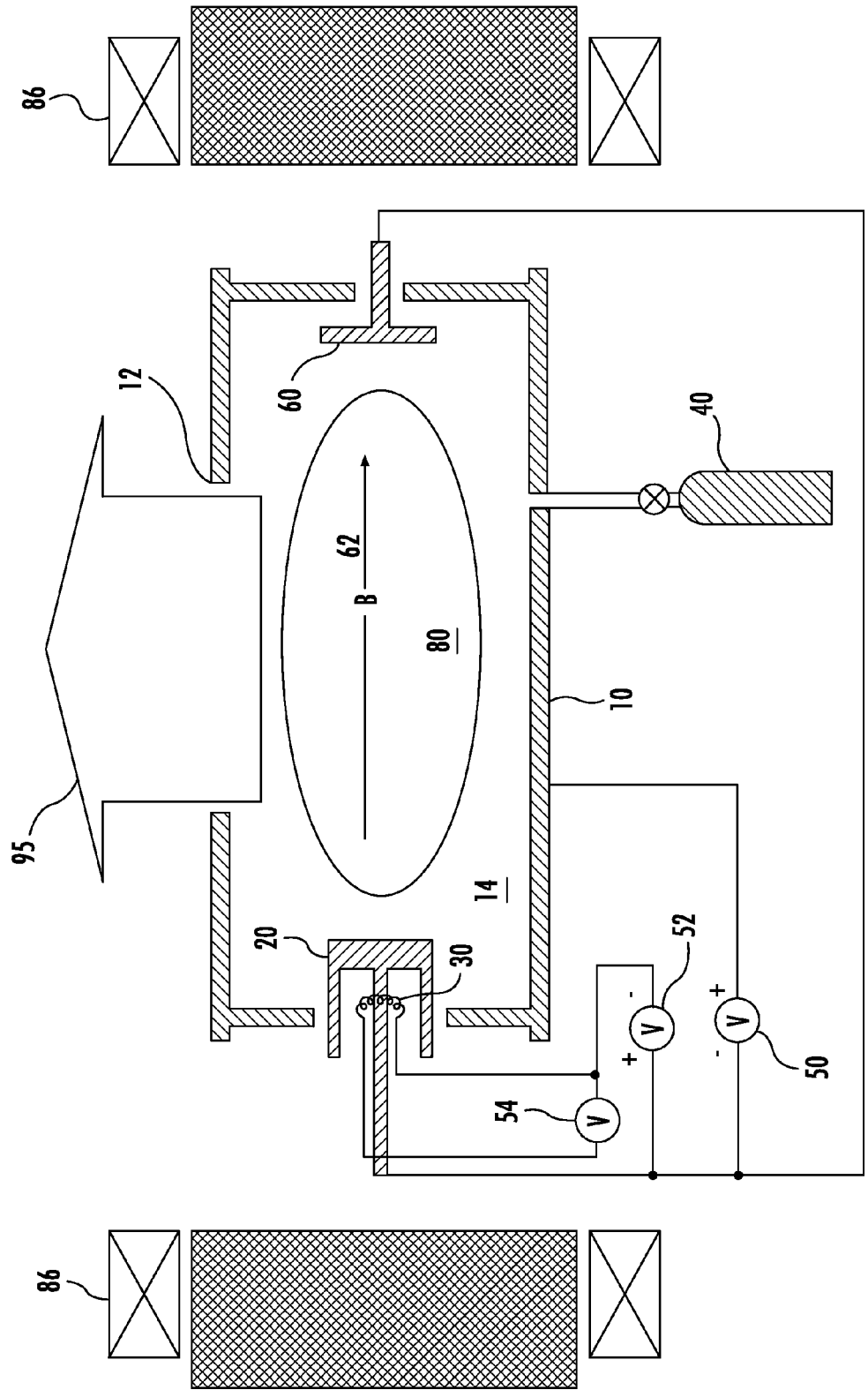
FIG. 2 illustrates a traditional ion source used in ion beam applications.
Figure 3:
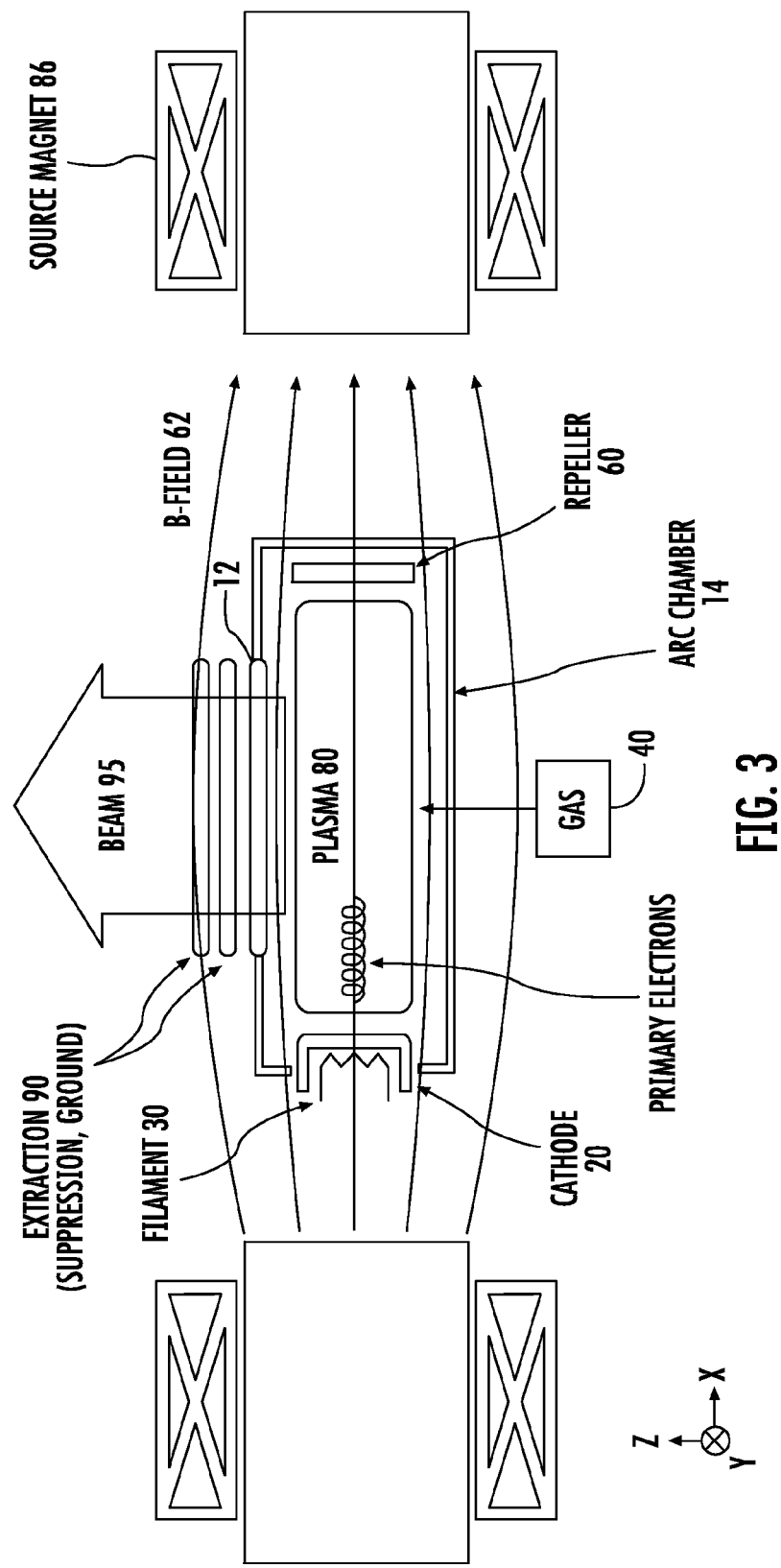
FIG. 3 shows the major components of the traditional ion source of FIG. 2.
Figure 6:
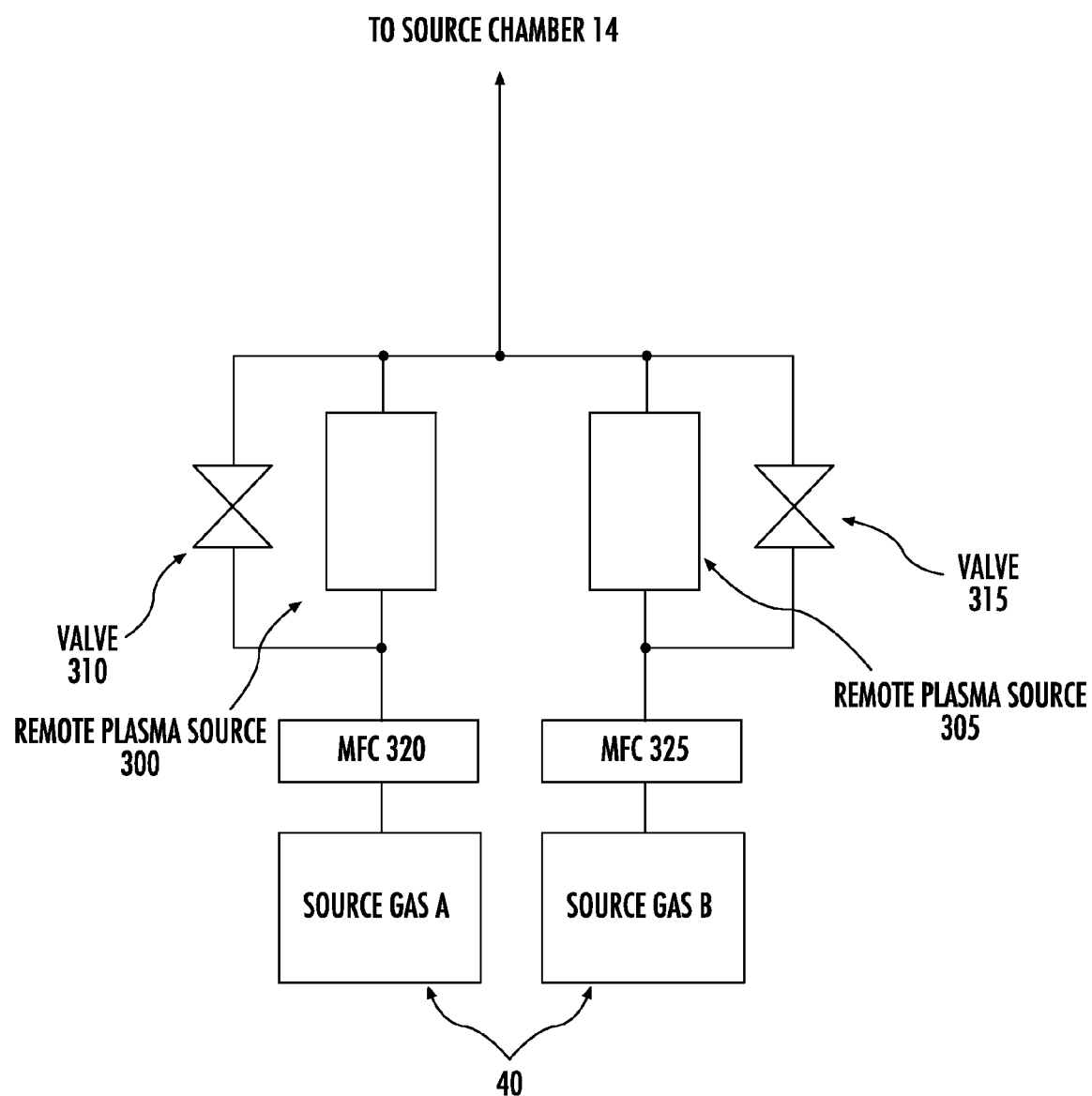
FIG. 6 shows a second embodiment of a gas injection system used in an ion beam application.

FIG. 6 illustrates a second embodiment of a gas injection system, usable with the ion source chamber of FIG. 3. In this embodiment, two different source gasses are each in communication with a separate mass flow controller (MFC) 320, 325. These MFCs 320, 325 are each in fluid communication with a remote plasma source 300, 305 and an adjustable bypass valve 310, 315, respectively. Through use of the MFCs, the flow rate of each source gas can be controlled. Additionally, through the use of adjustable bypass valves, the ratio of injected molecular source gas and source gas in altered states can be varied for each source gas independently. Additionally, more than 2 source gasses can be utilized by replicating the structure shown in FIG. 6. Finally, FIG. 6 shows a completely flexible system which allows the injection of Source Gas A, excited Source Gas A, Source Gas B, and excited Source Gas B. Each can be supplied in varying amounts, where each flow rate is completely independent of the other rates. However, not all of the illustrated components are required. For example, assume that in a particular embodiment, only Source Gas A and both states of Source Gas B are required. In this case, it is possible to eliminate remote plasma source 300 and adjustable bypass valve 310. Alternatively, if Source B is only required in its excited state, adjustable bypass valve 315 can be eliminated.

In some embodiments, two separate source gases allow for specialized components. For example, one source gas, bypass valve and remote plasma source can be dedicated to n-type dopants, while the second set of components is dedicated to p-type dopants to avoid potential cross-contamination and/or improve serviceability.

Figure 7:
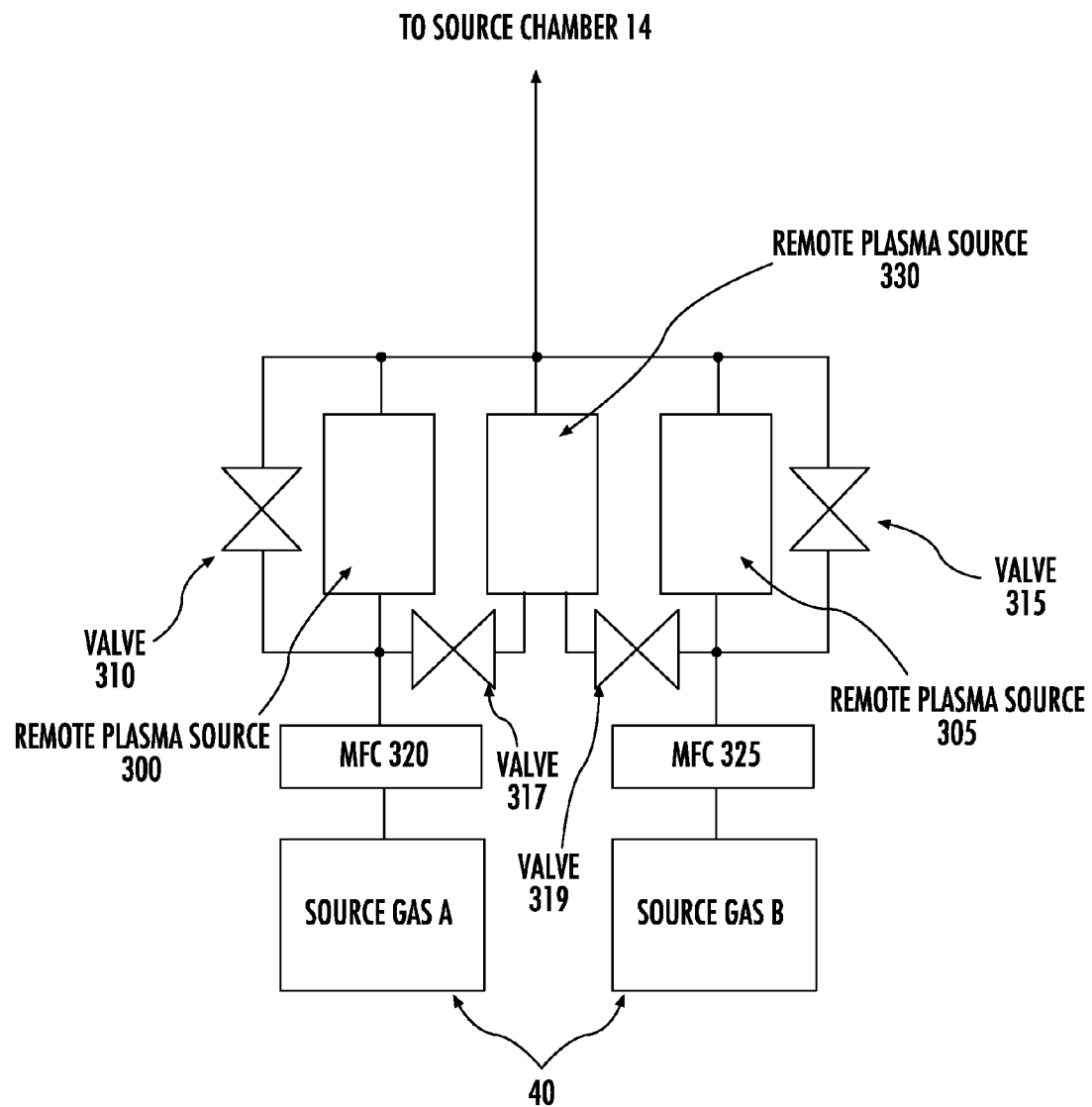
FIG. 7 shows a third embodiment of a gas injection system used in an ion beam application.

FIG. 7 illustrates another embodiment suitable for use with the ion source chamber 14 of FIG. 3. In this embodiment, a common remote plasma source 330 is utilized, whereby flows from both source gasses can enter a single plasma source. This deliberate reaction of two source gasses (which can be elemental or compound gasses) may be used to produce a new compound gas, which is then injected into the ion source chamber 14.

By doing so, desired molecules that are derived from the combination of multiple different gasses within the vacuum and environment of the source area and/or remote plasma area can be created. In other words, different gasses are fed into the vacuum environment or plasma chamber, so that they can react to create desired molecules. These molecules may be advantageous for specific purposes, such as implantation, deposition, or use in cleaning. The formation of molecules can be tailored by manipulating the plasma conditions via various control mechanisms, such as magnetic fields, flow, pressure, or electrical fields and/or properties, to create the desired effect. Thus, the formation of new or enhanced molecules could be realized and directly put to use in the process. One example of this would be to use two source gasses to introduce Hydride and Fluoride, which then combine to create HF, which is one of the more common molecules.

Adding multiple gasses and manipulating the conditions of the reaction within the chamber could allow the tailored formation of molecules that might otherwise be unstable, toxic, pyrophoric, dangerous, or have other characteristics that make them inconvenient to store and transport in bulk. Thus, in this embodiment, these molecules are only generated for point of use and for a desired effect.

Again, as described above, all of the components shown in FIG. 7 need not be present. For example, if Source Gas A and Source Gas B are only excited in a combined state, there is no need to include separate remote plasma sources 300, 305. Alternatively, if there is no need to inject the molecular form of one of the source gasses, the corresponding bypass valve can be eliminated.

The path length between the remote plasma sources 300, 305, 330 and the source chamber 14 is an important consideration. Should the path by too long, any metastable, excited or defragmented species would recombine prior to entering the ion source chamber 14. Several techniques can be employed to minimize the recombination of species exiting the remote plasma source. In certain embodiments, the physical distance between the remote plasma source and the ion source chamber is minimized. In other embodiments, a localized magnetic confinement scheme is utilized so that the energized electrons and ions can be delivered to the source chamber. In yet another embodiment, an orifice located proximate the output of the remote plasma source is used to provide the necessary pressure difference for different operating conditions.

The gas injection system of FIGS. 5-7 is primarily intended to be used in conjunction with the existing ion source in an ion beam system. Thus, the gas injection system is used to alter the gas before it enters the ion source chamber 14. Thus, the injected gas can be in different neutral conditions in terms of energy, configuration and fragmentation, since the ion source is used to then ionize the incoming gas.

Figure 8:
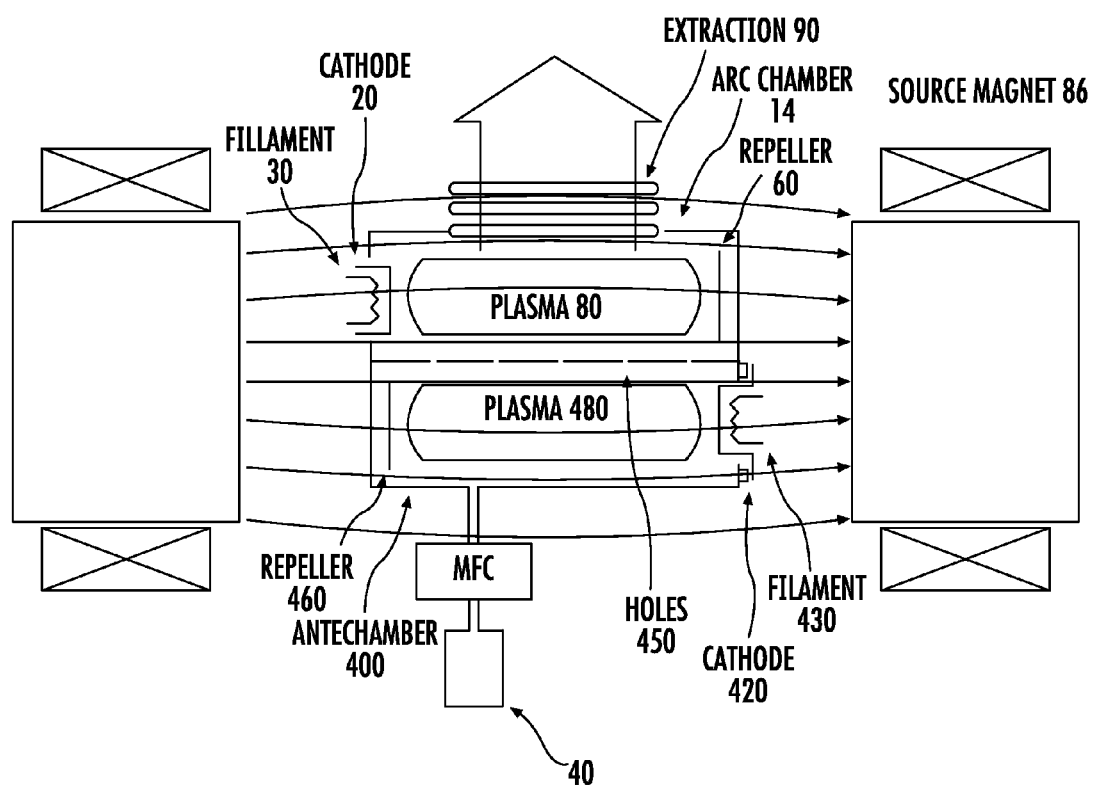
FIG. 8 shows a fourth embodiment of a gas injection system used in an ion beam application.

FIG. 8 shows another embodiment for use with an ion beam application. In this embodiment, a second chamber, known as an antechamber 400, is use to excite source gasses before they enter the ion source chamber 14. Gas from one or more gas sources 40 enter the antechamber 400. The antechamber 400 may have indirectly heated cathode 420, with a filament 430 on one end and a repeller 460 on the opposite end. While FIG. 8 shows repeller 460 on the left end of the antechamber, and repeller 60 on the right end of the ion source, this is not a requirement. For example, the repeller 460 of the antechamber and the repeller 60 of the ion source can be on the same side of their respective chambers. The same source magnet 86, used to confine electrons and ions within the source chamber 14, may also be used to provide the same function in the antechamber 400, if the antechamber and the ion source chamber are aligned, as shown in FIG. 8.

As mentioned above, gas flows into the antechamber 400, where it is treated to form excited neutrals as well as some ions. These excited molecules are then fed into the ion source chamber 14 via small openings or holes 450 on the top side of the antechamber. Note that in this embodiment, the top side of the antechamber also serves as the bottom of the ion source chamber 14. Thus, excited, defragmented and/or heavy neutrals enter the ion source chamber 14 after being treated in the antechamber 400. Also, since the electric fields are parallel in the ion source chamber 14 and the antechamber 400, a common magnetic field, such as that created by source magnet 86, can be used to confine the electrons, which are essential for ion source operation, in both chambers.

In certain embodiments, the holes 450 connecting the antechamber to the ion source chamber 14 are extremely small, such as 0.5 mm. In this way, the pressure in the antechamber 400 can be significantly different from that in the ion source chamber. As described above, by creating a remote plasma source, the formation of desired species can be optimized. For example, to produce heavier and metastable species, the antechamber is kept at a much higher pressure than the ion source chamber 14, such as at about 100-500 mTorr. This enables heavier excited neutral species, such as $P_2$ and $P_4$ to be created. These molecules are then allowed to pass into the ion source chamber 14, through the small holes connecting the chambers to be ionized.

Alternatively, high power and low pressure is used to create mono-atomic species. For example, boron tri-fluoride can be supplied to the antechamber 400. The cathode 420 in the antechamber 400 serves to break the gas into a variety of ionic species and excited neutrals. These species are then fed into the ion source chamber where they are further broken down before being extracted as an ion beam. By pre-treating the gas, the concentration of specific charged ions, e.g. $B^+$, is increased, resulting in an increased ion beam current for specific species.

While the above description utilizes a indirect heated cathode (IHC) ion source as the antechamber, other types of plasma sources may be used to create the antechamber. For example, traditional bernas-style ion sources, hollow-cathode style sources or filament based ion sources may also be used. In other embodiments, other types of plasma sources as described earlier can be used.

Figure 4:
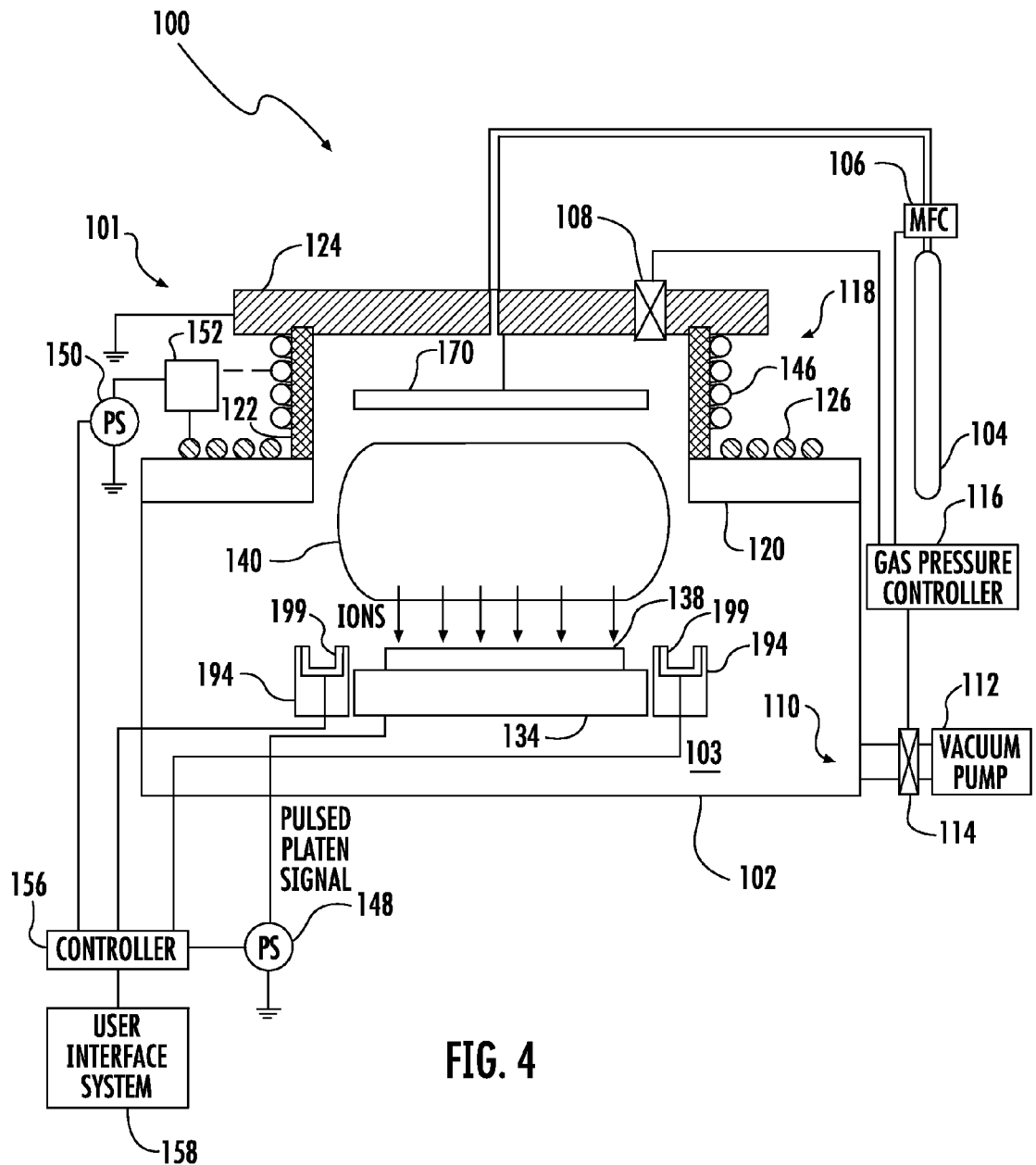
FIG. 4 illustrates a plasma immersion system.

In other embodiments, ion implantation is performed using plasma immersion. Altered source gas injection can be used for plasma immersion implantation, as well. As shown in FIG. 4, source gas enters the process chamber 102 via a conduit near the top of the volume. It is then converted to plasma using antennae 126, 146, and diffuses above the wafer. Baffles 170 serve to disperse the plasma relatively uniformly within the chamber 102. For these implantation applications, controlling the plasma uniformity and the deposition pattern is critical to achieve acceptable implant uniformity. However, asymmetries from plasma generation and plasma confinement make it difficult to attain this goal for some applications, especially for low-energy applications. In addition, asymmetric pumping can add additional non-uniformity to the system.

Figure 9:
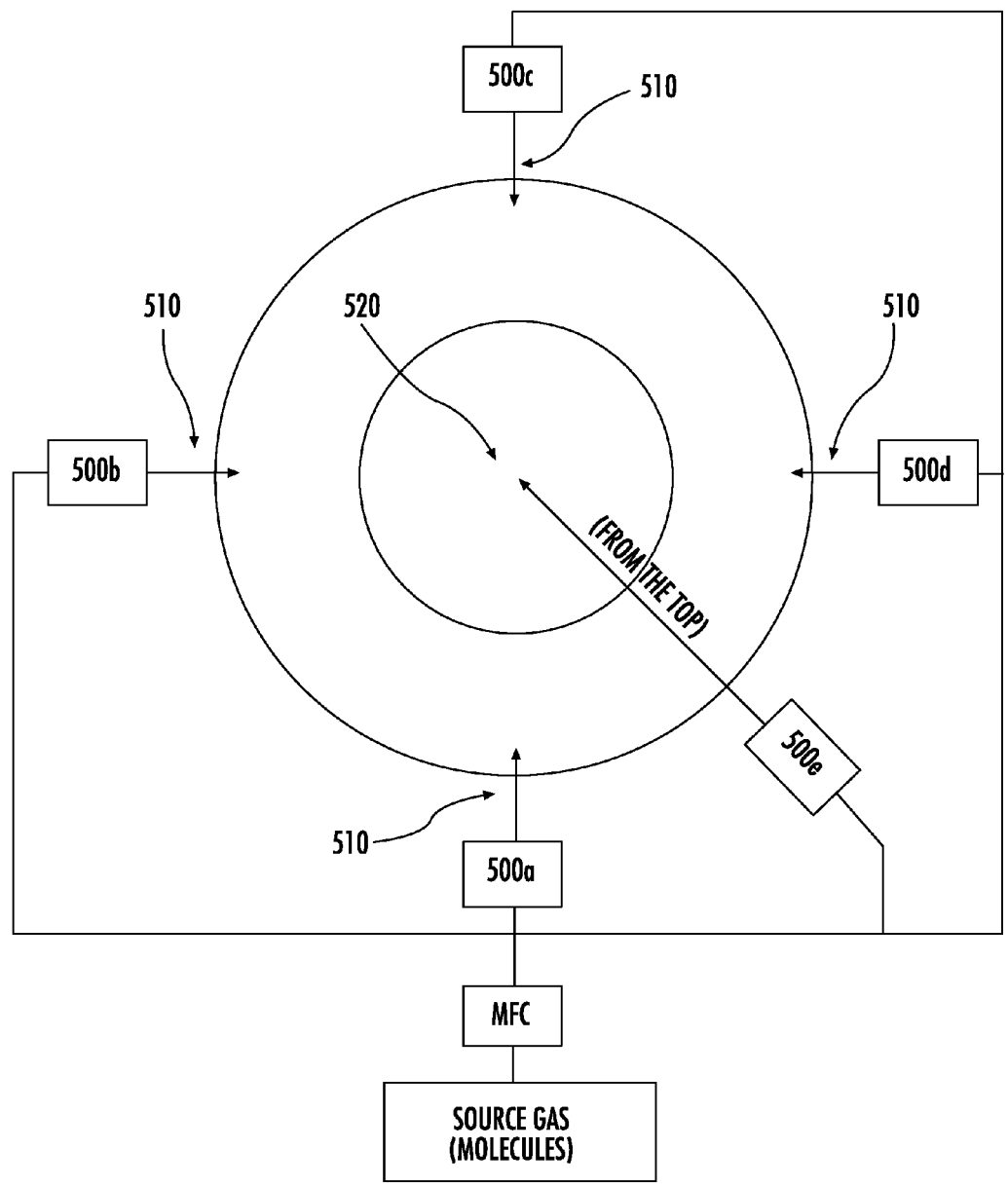
FIG. 9 shows an embodiment of a gas injection system used in a plasma immersion system.
Figure 10:
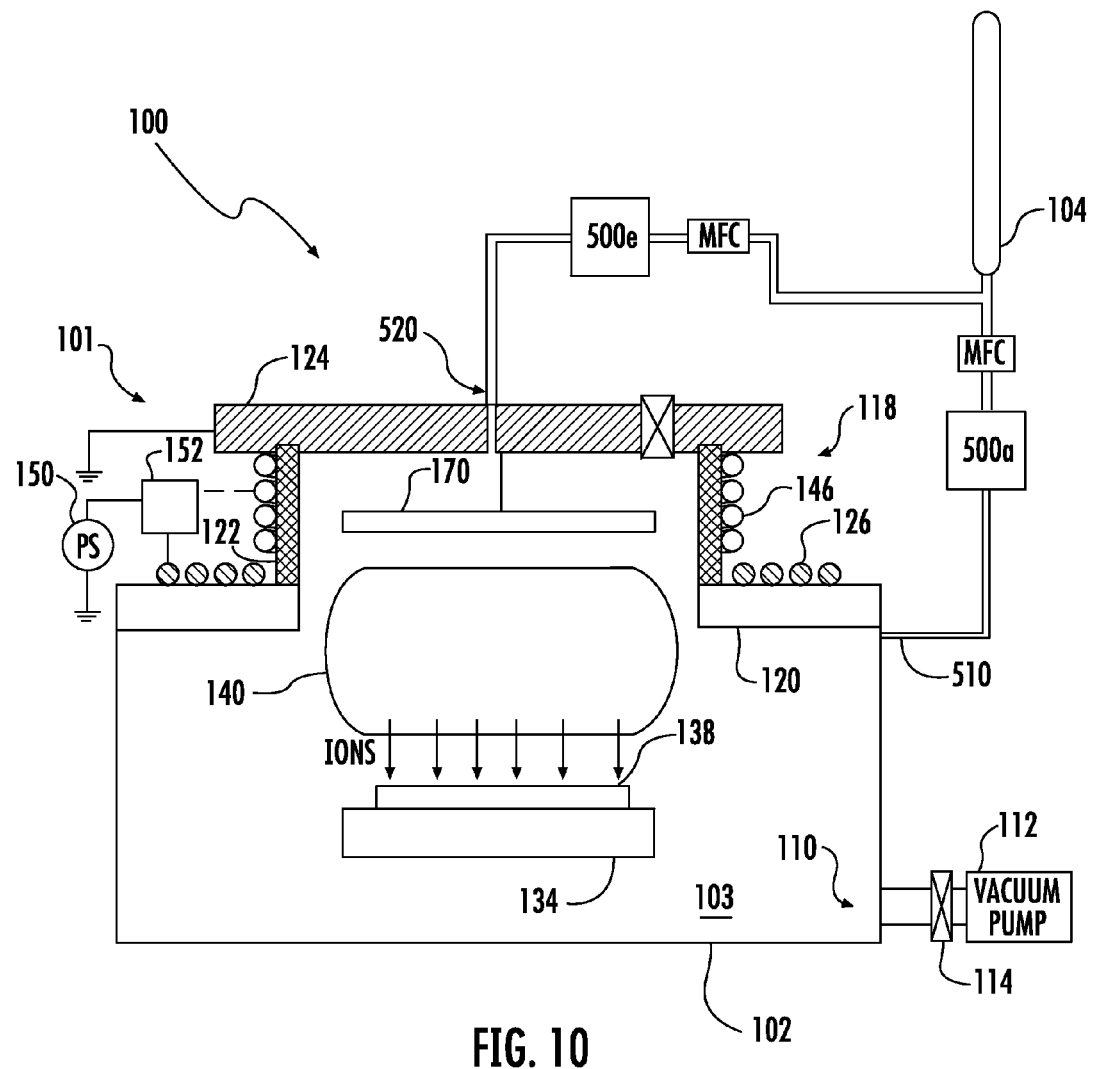
FIG. 10 shows a second view of the gas injection system of FIG. 9.

In order to compensate for this uniformity, gas injection locations 510 can be added to the process chamber 102. FIG. 9 shows the addition of several remote plasma sources 500. These remote plasma sources can be of the types described above in reference to ion beam implantation system. Each remote plasma source receives a source gas, such as from a central reservoir. This gas is then altered to create plasma, ions, excited neutrals and metastable molecules. As described above, different pressures and power levels can be used to create different characteristics, depending on the specific species desired. These altered states can then be injected into the process chamber 102. In FIG. 9, 4 side injection locations are shown. However, this is only one embodiment; a greater or lesser number of injection locations can also be provided. Note that the preferred injection locations are along the side of the process chamber 102, near the antenna 126, as shown in FIG. 10. This allows the effect from planar antenna 126 to excite the injected gas into a plasma, thereby helping to improve the uniformity over the workpiece. In certain embodiments, the rate of excited gas flow into each of the gas injection locations is the same, but only the power on each remote plasma source 500 is adjusted. However, if asymmetrical gas injection is desired, a mass flow controller (MFC) can be located between the source gas reservoir and each of the remote plasma sources 500. Thus, the uniformity of the plasma and that of the neutrals within the chamber can be improved.

Although FIG. 9 shows the output of the remote plasma source being directly in communication with the injection locations, this is not a requirement of the present disclosure. For example, any of the configurations shown in FIGS. 5-7 can be used in conjunction with the system of FIG. 9. In other words, a mix of source gas and altered molecules (as shown in FIG. 5) can be supplied to one or more injection locations. Similarly, a mixture of two gasses and their altered versions (as shown in FIG. 6) can also be supplied to one of more injection locations. Finally, the configuration shown in FIG. 7 can also be used to supply gasses to one or more injection locations. The components for these configurations can be replicated for each injection location. Alternatively, one such set of components may be shared for two or more injection locations.

In another embodiment, shown in FIG. 10, the gas injection location 520 located on the top of the process chamber 102 is supplied with molecules from a remote plasma source 500e. The use of a remote plasma source to pre-treat the gas can be used to compensate for fundamental asymmetries caused by the plasma source and/or confinement. A remote plasma source 500e supplies gas to this injection location. This remote plasma source can be any suitable device, such as those described above.

In operation, gas source 104 supplies one of more gasses to one or more remote plasma sources 500. These remote plasma sources excite the source gas as described above. The altered gas is then fed into the plasma chamber 102 via injection locations 510. In some embodiments, different rate flows are required at each injection location, so separate MFCs are used for each injection location. In certain embodiments, the altered gas to be supplied to the injection locations is the same, and therefore only one remote plasma source is used to supply gas to all injection locations, where the flow rate at each location is controlled by an independent MFC. In other embodiments, the altered gas to be supplied to each injection location may differ. For example, it may be desirable to inject more heavy species near the outer edge of the plasma chamber 102, as these species do not diffuse as readily as lighter ions. In this scenario, more than one remote plasma source 500 may be used.

While this disclosure describes specific embodiments disclosed above, those of ordinary skill in the art will recognize that many variations and modifications are possible.

Accordingly, the embodiments presented in this disclosure are intended to be illustrative and not limiting. Various embodiments can be envisioned without departing from the spirit of the disclosure.

What is claimed is:

1. An ion source comprising:
   an ion source chamber housing defining an ion source chamber, the ion source chamber housing having a side with a plurality of apertures; and
   an antechamber housing defining an antechamber, the antechamber housing sharing the side with the plurality of apertures with the ion source chamber housing, the antechamber housing having an opening to receive a gas from a gas source, wherein the antechamber is configured to transform the gas into an altered state comprising excited neutrals that is provided through the plurality of apertures into the ion source chamber,
   wherein the ion source chamber comprises a first indirectly heated cathode disposed on one end of the ion source chamber housing, configured to emit electrons into the ion source chamber to interact with the gas in the altered state to generate plasma in the ion source chamber.

2. The ion source of claim 1, further comprising a source magnet positioned proximate the ion source chamber housing and the antechamber housing, the source magnet configured to provide a magnetic field for both the ion source chamber and the antechamber that confines electrons within each of the ion source chamber and the antechamber, respectively.

3. The ion source of claim 1, wherein the antechamber comprises a second indirectly heated cathode configured to emit electrons into the antechamber that interact with the gas to transform the gas into the altered state.

4. The ion source of claim 1, wherein the plurality of apertures has a quantity and dimension to enable the antechamber to operate over an antechamber pressure range and the ion source chamber to operate over an ion source chamber pressure range different from the antechamber pressure range.

5. The ion source of claim 4, wherein the antechamber pressure range is higher than the ion source chamber pressure range and does not overlap with the ion source chamber pressure range.

6. The ion source of claim 5, wherein the antechamber pressure range is between 100-500 mTorr.

7. The ion source of claim 1, wherein the altered state further comprises one or more of plasma, ions, and metastable molecules.

8. The ion source of claim 1, further comprising a first repeller disposed on an opposite end of the ion source chamber housing.

9. The ion source of claim 8, wherein the antechamber comprises a second indirectly heated cathode disposed on one end of the antechamber housing configured to emit electrons into the antechamber that interact with the gas to transform the gas into the altered state, and a second repeller disposed on an opposite end of the antechamber housing.

10. The ion source of claim 9, where the second repeller and the first indirectly heated cathode are disposed on the same end of the ion source.

11. The ion source of claim 9, where the second repeller and the first repeller are disposed on the same end of the ion source.

12. The ion source of claim 1, wherein the ion source chamber housing comprises a second side having an extraction aperture, the second side opposite the side with the plurality of apertures.

* * * * *